(12) United States Patent
Halter

(10) Patent No.: US 6,900,390 B2
(45) Date of Patent: May 31, 2005

(54) FLEXIBLE MICROSTRIP SIGNAL AND POWER BUS CABLE

(75) Inventor: Michael A. Halter, Conway, AR (US)

(73) Assignee: Syair Designs LLC, Sherwood, AR (US)

( * ) Notice: Subject to any disclaimer, the term of this patent is extended or adjusted under 35 U.S.C. 154(b) by 0 days.

(21) Appl. No.: 10/802,195

(22) Filed: Mar. 17, 2004

(65) Prior Publication Data

US 2004/0182595 A1 Sep. 23, 2004

Related U.S. Application Data

(60) Provisional application No. 60/455,269, filed on Mar. 17, 2003, provisional application No. 60/455,129, filed on Mar. 17, 2003, provisional application No. 60/455,126, filed on Mar. 17, 2003, and provisional application No. 60/455,127, filed on Mar. 17, 2003.

(51) Int. Cl.[7] ............................................. H01B 7/04
(52) U.S. Cl. .............. 174/117 F; 174/100; 174/117 FF; 174/72 TR; 174/113 A; 333/238; 333/243
(58) Field of Search ...................... 174/100, 117 FF, 174/117 F, 113 A, 72 TR; 333/238, 243

(56) References Cited

U.S. PATENT DOCUMENTS

| | | |
|---|---|---|
| 5,317,292 A | 5/1994 | Leeb |
| 5,373,109 A | 12/1994 | Argyrakis et al. |
| 5,420,482 A | 5/1995 | Phares |
| 5,631,446 A | 5/1997 | Quan |
| 5,847,324 A * | 12/1998 | Farquhar et al. ....... 174/117 FF |
| 6,016,038 A | 1/2000 | Mueller et al. |
| 6,020,559 A | 2/2000 | Maeda |
| 6,055,722 A | 5/2000 | Tighe et al. |
| 6,150,774 A | 11/2000 | Mueller et al. |
| 6,166,496 A | 12/2000 | Lys et al. |
| 6,211,626 B1 | 4/2001 | Lys et al. |
| 6,292,901 B1 | 9/2001 | Lys et al. |
| 6,323,428 B1 * | 11/2001 | Takano ................... 174/117 F |
| 6,340,868 B1 | 1/2002 | Lys et al. |
| 6,501,166 B2 | 12/2002 | Wood et al. |
| 6,528,954 B1 | 3/2003 | Lys et al. |
| 6,548,967 B1 | 4/2003 | Dowling et al. |
| 6,577,080 B2 | 6/2003 | Lys et al. |
| 6,608,453 B2 | 8/2003 | Morgan et al. |
| 6,624,597 B2 | 9/2003 | Dowling et al. |

OTHER PUBLICATIONS

MAX5258/MAX5259 Data Sheet, Maxim Integrated Products, Sunnyvale, CA (2001).
Application Note, "SPI Interface Used in a Daisy–Chain," Infineon Technologies AG, Munich, Germany (2000).
LM2674 Simple Switcher Power Converter High Efficiency 500 mA Step–Down Voltage Regulator Data Sheet, Naitonal Semiconductor Corporation, Santa Clara, CA (2001).

* cited by examiner

Primary Examiner—Dean A. Reichard
Assistant Examiner—Jinhee Lee
(74) Attorney, Agent, or Firm—J. Charles Dougherty

(57) ABSTRACT

A multi-layered, flat, flexible cable capable of transmitting both power and multiple control signals to the components of a network is disclosed. The cable provides all connections on its top surface using a via-less design that does not reduce the cross-sectional area of power and ground buses within the cable. This effect is achieved through the use of folded conducting tabs appearing at periodic intervals along one of the power and ground conducting layers, which are folded over onto the top of the cable for electrical connection thereto.

15 Claims, 2 Drawing Sheets

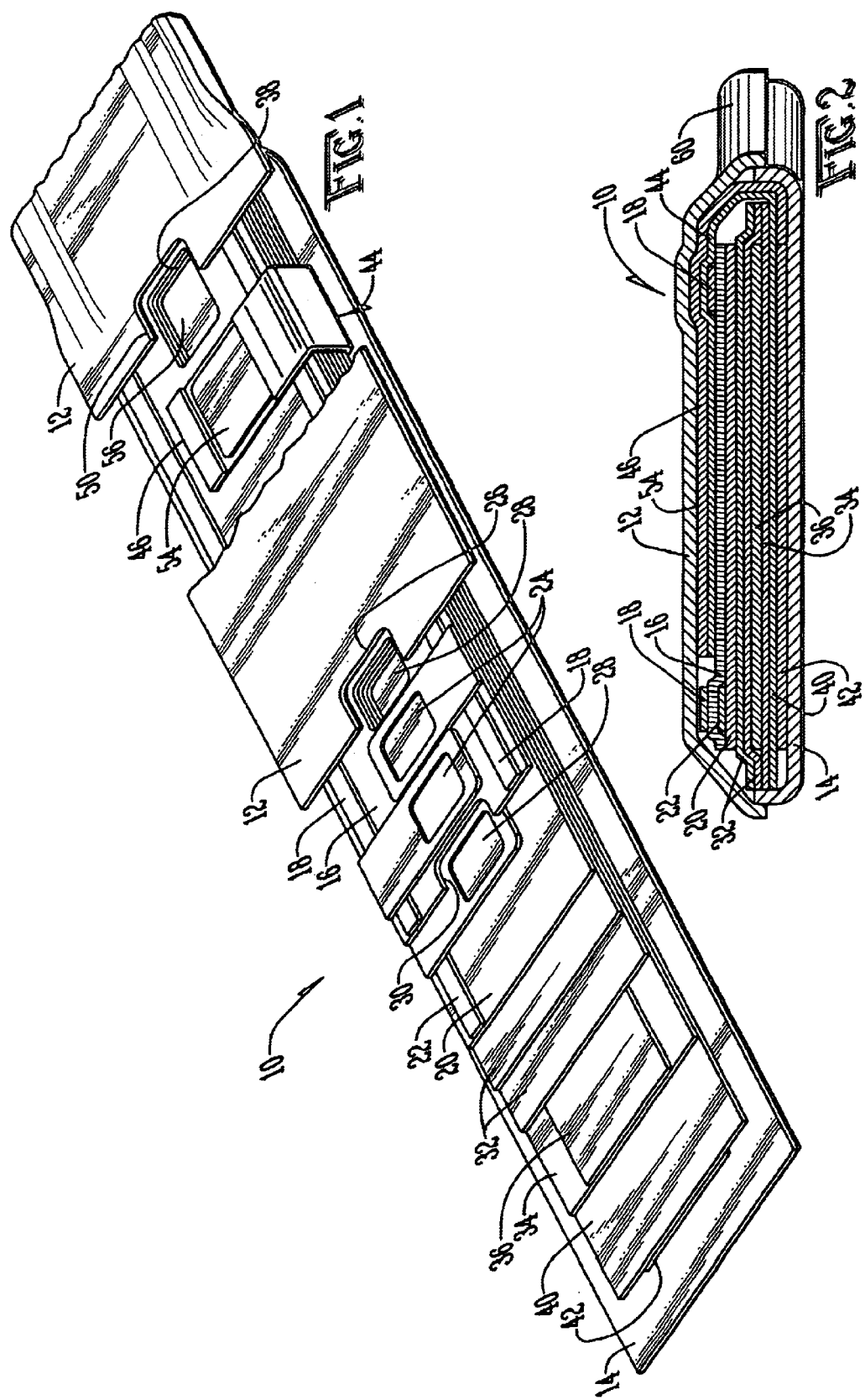

FLEXIBLE MICROSTRIP SIGNAL AND POWER BUS CABLE

CROSS-REFERENCE TO RELATED APPLICATIONS

The present application claims the benefit of U.S. provisional patent applications Ser. Nos. 60/455,269, entitled "Spectrally Calibratable Multi-Element RGB LED Light Source"; 60/455,129, entitled "Indirect Lighting System Architecture and Implementation"; 60/455,126, entitled "Anisotropic Etching of Silicon Wafer Materials to Create Micro-Reflector Cavities for LED Die"; and 60/455,127, entitled "Micro-Strip-Line Signal and Power Bus Flexible Cable and Method of Using Same," each of which was filed on Mar. 17, 2003, and for each of which the inventor is Michael A. Halter. The present application is further related to the three co-pending applications filed on even date herewith entitled "Indirect Lighting System Architecture and Implementation," "Anisotropic Etching of Silicon Wafer Materials to Create Micro-Reflector Cavities for LED Die", and "Spectrally Calibratable Multi-Element RGB LED Light Source," the inventor for each of which is Michael A. Halter. The entire disclosure of each of the foregoing provisional and non-provisional applications are incorporated herein by reference.

BACKGROUND OF THE INVENTION

The present invention relates to power and signal buses for electrical networks, and in particular to multi-layer cable systems providing combined power and signal connections to a network of electrical and electronic components.

The interconnection of multiple electrical or electronic components in a network requires a consideration of the requirements of the various components of the network and the environment in which the network will be installed. In the simplest such systems, only a conductor carrying power to each device is required. The device is "on" when power is distributed along the conductor, and is "off" when power is no longer maintained. No separate control signal lines are thus required. Multiple components may be maintained on a power network of this type by connecting components in series, in parallel, or in various combinations of serial/parallel networks as desired in order to meet operational requirements of the system.

The problems of interconnecting components becomes more complex when control signals must be directed to the various components separate from the distribution of power. The simplest control signal solution for this type of network, which also requires the greatest quantity of wiring, is to maintain a separate control line or lines to each of the components in the system. In order to reduce the quantity of wiring, many networks use a single control line that has a connection to each component in the network. If this arrangement is to be employed, however, some means of component addressing must be employed so that each element of the network can determine to which control signals it must respond. The most complex systems may require multiple control signal communications buses in addition to a power distribution system, even where an addressing scheme is employed. These types of systems will require considerable quantities of wiring in order to form all of the necessary connections even though addressing is employed to reduce the number of necessary control lines. Large quantities of wiring increases the cost of the network, not only due to the cost of the wiring itself but since the complex wiring increases the time involved in installing and maintaining such a system.

The simplification of power and signal interconnections on a network of components becomes even more important when the network is installed in an environment where available space and system weight is tightly limited. Examples of such a space include the cabin sections of aircraft and watercraft. The particular difficulty faced by the inventor hereof was the interconnection of a complex, multi-module light emitting diode (LED) lighting system in such an environment. Each lighting module of the LED system is connected to multiple control networks and to a power system. Using a standard wiring scheme would result in large bundles of wiring in order to implement such a network, rendering installation and maintenance difficult and time-consuming.

Flexible microstrip and stripline electrical connecting cables are known in the art. Generally speaking, a "microstrip" may be described as a flat strip of conducting material applied onto a dielectric, such as on a printed circuit board, or a flat strip of conducting material flanked by only one ground plane. A "stripline" may be defined as a flat strip of conducting material encased in a dielectric, or otherwise surrounded on both its upper and lower surfaces by a dielectric material or ground planes. These terms are sometimes used interchangeably, and the terms "stripline" and "microstrip" as used herein should each be understood to encompass both types of devices. While this technology is most often applied directly onto (or into) multi-layer printed circuit boards, it has also been applied in transmission lines located off of circuit boards as well. One commonplace application of this technology is in the area of high-frequency antennas or communications networks, particularly microwave systems. Microstrip and stripline connectors are popular in these applications because they reduce radiation leakage as would be experienced in co-axial or other types of connecting lines.

The general construction of a flexible stripline conductor involves multiple layers of conducting elements and dielectric elements. For example, U.S. Pat. No. 5,631,446 to Quan teaches a radio frequency (RF) flexible printed wiring board transmission line for connection strip transmission line microwave assemblies. The flexible transmission line includes a thin flexible dielectric ribbon sandwiched between a ground plane conductor on one side and a microstrip conductor on the other side. Flat cables having a greater number of conducting and insulating layers are also known; examples include the flat cable taught by U.S. Pat. No. 5,373,109 to Argyrakis et al.

The prior art also teaches means of connecting the various conductive layers of a flat cable to other cables or the components of a network. It is often desirable in certain applications for multiple connections to be made on a single side of such a flat conductor. This may be implemented by the use of "vias" formed through some of the flat cable's layering. In essence, a via is simply a hole through some of the cable's outer layers that allows access to a conducting layer within the cable. For example, Quan '446 teaches that vias formed in the transmission line at its ends allow connection of the ground and conductor strips from the same side of the flat transmission line. U.S. Pat. No. 6,020,559 to Maeda teaches a flat flexible cable with electrically insulating films on either side of the flat conductors, with a plurality of access openings through the films to the conductors. Alternative arrangements to the via approach for interconnections are also employed in prior art devices. U.S. Pat. No. 6,055,722 to Tighe et al. teaches a stair-step type arrangement of layers in a stripline flexible cable, with the individual ends forming the stair step arrangement available for separate connection to a printed circuit board.

The prior art flat transmission lines as herein described, while offering some advantages over traditional round cable in certain applications, are not optimized for use in applications where a combination of power and ground signals are required through a single, flexible flat cable. In particular, the interconnect mechanisms for flat cable taught in the prior art would not allow for a modular network, where individual components on the network could be easily connected and disconnected to a single flat cable providing both power and signal inputs. In addition, the interconnect mechanisms taught in prior art flat cables do not maximize the conductor area available to power and system ground conductors. Limitations on the conductor area for the power and ground conductors means that the overall width of the flexible cable must be increased in order to accommodate a given current level. In such a case, the flexible cable may by necessity become wider than the network components themselves, which increases the space required for installation of the components. The present invention overcomes these disadvantages and limitations of the prior art as explained below.

BRIEF SUMMARY OF THE INVENTION

A flexible cable is described for use in distributing power and data bus communications throughout a control network. This flexible cable allows one connection to be made to service the entire control network, eliminating the need for interconnections between control nodes on the network.

In a preferred embodiment, the cable consists of multiple layers, including a power bus layer, a ground bus layer, one or more signal bus layers, multiple dielectric layers separating these conducting layers, and top and bottom film protective cover layers. Despite its multi-level arrangement, however, the cable is designed to permit access to all layers of the cable from one side (the "top" side) of the cable without the use of vias. The employment of vias in prior art designs reduces the cross-sectional area of the conductive material (preferably copper) comprising the internal layers, which reduces the level of electrical current that the cable can safely carry. The elimination of vias while still allowing access to all power and control conductors at the top of the cable is achieved through the employment of a fold-up cable tab design. Tabs extending from conducting layers are folded around and on top of the cable during construction, allowing access to all layers at different points along the cable's length. Preferably, these connection points are maintained at regular intervals along the cable's length based on the size and mounting particularities of the various components of the network to be interconnected by the cable. By maximizing the cross-sectional area of the full copper layers (particularly the power and ground bus layers) of the cable, this design maximizes the current carrying ability of the cable, permitting the cable to power greater electrical loads for a given overall cable width. This design thus avoids the use of vias as in traditional multi-layer flat cables, which reduce the cross-sectional area of the conducting layers.

The power and ground layers preferably consist of a solid copper foil which is substantially the full width of the flex cable. The contact areas to these internal layers are preferably gold plated. These gold-plated areas, which are folded up onto the top portion of the cable, provide pads for the mounting of network components. The cable snaps into a mounting track or other means, with components snapped into place such that electrical pads are pressed into position with their respective contacts. The overall flexible design maximizes the space available to have a product that is not any wider than the controlled device itself. This maximizes the size and weight efficiency of the electronic control system. The via-less design eliminates the issue of via failure, which is associated with the traditional plated-through-hole interconnects on heavy copper foil cables.

It is therefore an object of the invention to create a flexible flat cable that incorporates both power and signal conductors.

It is a further object of the invention to create a flexible flat cable of a reduced width.

It is a further object of the invention to create a flexible flat cable without non-surface interconnections between the cable and system components.

It is a further object of the invention to create a flexible flat cable with minimum voltage drop over the length of the cable for a given width.

It is a further object of the invention to create a flexible flat cable that may be field cut for ease of installation.

It is a further object of the invention to create a flexible flat cable that may be mass produced inexpensively.

It is a further object of the invention to create a flexible flat cable of modular design that may be constructed in a length as appropriate to a particular application.

These and other features, objects and advantages of the present invention will become better understood from a consideration of the following detailed description of the preferred embodiments and appended claims in conjunction with the drawings as described following.

BRIEF DESCRIPTION OF THE SEVERAL VIEWS OF THE DRAWINGS

FIG. 1 is a partial cut-away, perspective view of a preferred embodiment of the present invention.

FIG. 2 is a cross-sectional view of a folded power conductor tab of a preferred embodiment of the present invention.

DETAILED DESCRIPTION OF THE INVENTION

Figure 3:
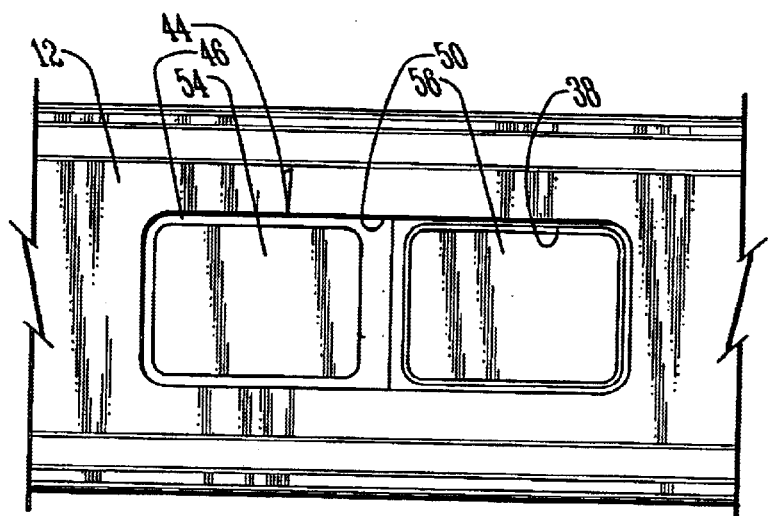
FIG. 3 is a top plan view of a section of a cable of a preferred embodiment of the present invention, showing power and ground pad connections.

The preferred embodiment of the invention is a flexible, flat cable 10 for use in a network connecting components of an LED lighting system for installation in the cabin section of an aircraft or watercraft, as shown in FIG. 1. All necessary power and data bus communications connections to the control devices are supplied through cable 10. Cable 10 may be constructed using reel-to-reel flexible circuit processing techniques as are known in the art.

Cable 10 is protected on its upper and lower sides by top cover film 12 and bottom cover film 14, respectively. In the preferred embodiment, top cover film 12 is constructed of a 0.001 inch layer of polyimide film with a 0.001 inch layer of modified acrylic adhesive bonding applied to its lower surface. The polyimide film material with a suitable acrylic adhesive is available from Rogers Corporation of Chandler, Ariz. as part no. RFLEX2005C110. Bottom cover film 14 is constructed of a 0.002 inch layer of polyimide film with a 0.002 inch layer of modified acrylic adhesive, which is available from Rogers Corporation as part no. RFLEX2005C220. Other materials may be used, but the acrylic adhesive chosen should preferably be of a form that contains flame retardant halogen compounds, such that it meets or exceeds the "self-extinguishing" UL94-VTM-0 standard.

Signal communication layer 16, lying just below top cover film 12, is preferably constructed of 0.00294 inch (2 ounce) rolled anneal copper foil with a 0.002 inch polyamide film laminated to one side of the copper foil. The copper foil is chemically etched creating signal conductors 18 supported by the 0.002 inch polyamide film. In the preferred embodiment, signal communication layer 16 has two copper foil signal conductors 18 on its surface, positioned opposite one another near the outer edges of signal communication layer 16. This arrangement allows for access to signal conductors 18 through top film opening 26 via signal pads 24. Signal pads 24 are preferably electrically connected to signal conductors 18 in a continuous strip of conducting copper foil formed simultaneously with and as a part of signal conductors 18. As shown in FIG. 1, signal pads 24 extend inwardly from either side of signal communication layer 16 and lie next to one another longitudinally within top film opening 26. In this manner, two different conducting signal paths are formed from a single layer disposed within cable 10, each of which may be accessed at the top side of cable 10. Signal communication layer 16 is adhered to the top cover film 12 via the 0.001 inch layer of modified acrylic adhesive located on the underside of top cover film 12. Materials comprising the signal communication layer 16 may be obtained in the preferred embodiment from Rogers Corporation as part no. RFLEX2005K220.

Beneath signal communication layer 16 is enumerator communication layer 20. Enumerator layer 20 is preferably constructed of 0.00294 inch (2 ounce) rolled annealed copper foil with a 0.002 inch polyamide film laminated to one side of the copper foil. The copper foil is chemically etched creating enumeration conductors 22 supported by the 0.002 inch polyamide film. In the preferred embodiment, signal communication layer 16 has a single copper foil enumerator conductor 22 on its surface, positioned near one of the outer edges of enumerator communication layer 20. This arrangement allows for access to enumerator conductor 22 through top film opening 26 and signal layer opening 30 via enumerator pad 28. Enumerator pad 28 is electrically connected to enumerator conductor 22 in a continuous strip of conducting copper foil formed simultaneously with and as a part of enumerator conductor 22. As shown in FIG. 1, enumerator pad 28 extends inwardly from the side of enumerator communication layer 20 to lie within and longitudinally aligned with both top film opening 26 and single layer opening 30. In this manner, the enumerator signal conducting path can be reached on the surface of cable 10, and from the point of view of network connection can be treated just as a third signal conducting path similar to those on signal communication layer 16. In the preferred embodiment, signal pads 24 and enumerator pad 28 are positioned longitudinally next to one another for ease of signal connection with the components of the network interconnected by cable 10. Enumeration layer 20 is adhered to signal communication layer 16 using a 0.002 inch thick layer of modified acrylic adhesive located between enumeration communication layer 20 and signal communication layer 16. Materials comprising enumeration communication layer 20 may be obtained from Rogers Corporation as part no. RFLEX2005K220.

Underneath enumerator layer 20 in the preferred embodiment of the present invention lie two dielectric layers 32. Dielectric layers 32 are composed of two 0.008 inch thick polyamide films with a 0.001 inch layer of acrylic adhesive on one side. The 0.001 inch layer of acrylic adhesive is used to bond the two polyamide films together and to adhere dielectric layers 32 to the lower face of enumeration communications layer 20. The purpose of dielectric layers 32 is to provide sufficient shielding between the signal conducting components of cable 10 and the power conducting components of cable 10, as will hereinafter be described. The shielding is important given the high-frequency nature of the signals that will be carried by signal conductors 18 and enumerator conductor 22 in the preferred embodiment. In particular, high-speed serial data will be employed in the operation of LED light modules as contemplated in the preferred embodiment of cable 10. Again, materials for the dielectric layers 32 may be obtained from Rogers Corporation of Chandler, Ariz.

Beneath dielectric layers 32 in a preferred embodiment of the present invention lies ground bus layer 34. Ground bus layer 34 is formed of a 0.00441 inch (3 ounce) rolled annealed copper foil adhered to a 0.001 inch thick polyimide film utilizing a 0.002 inch modified acrylic adhesive with the copper foil facing upward in the assembly. The copper foil makes up the ground bus conductor 36 for the ground bus layer 34. It should be noted that in the preferred embodiment ground bus conductor 36 is quite wide with respect to the overall width of cable 10, covering the middle portion of ground bus layer 34 to near the edges of ground bus layer 34. Since the maximum current that may be passed through a conductor is a function of, among other things, the cross-sectional area of the conductor at its narrowest point, this constant width allows a high electrical current to pass through ground bus layer 34 within the parameters allowed by the materials being used and safety requirements for the system. Ground layer 34 is bonded to the lower of the dielectric layers 32 in the preferred embodiment of the present invention with an unsupported layer of 0.002 inch modified acrylic adhesive. Such materials may be obtained from Rogers Corporation.

Ground bus conductor 36 is reached by components in the network mounted with respect to cable 10 through top film ground conductor opening 38. This opening passes through top cover film 12, signal layer 16, enumerator layer 20, and both dielectric layers 32. It should be noted that because of the unique design of the preferred embodiment of the invention, these passages do not limit the cross-sectional area of any part of any conductor embedded in cable 10. The opening passes between signal layer conductors 18 and to one side of enumerator conductor 22. Performance of cable 10 is not compromised because the current requirements in the signal conducting layers are not critical, and thus the cross-sectional area of these conductors is not a limiting factor in the design of cable 10.

Beneath ground bus layer 34 lies power bus layer 40. Power bus layer 40 is formed of a 0.00441 inch (3 ounce) rolled annealed cooper foil adhered to a 0.001 inch thick polyimide film utilizing a 0.002 inch modified acrylic adhesive layer with the copper foil facing downward in the assembly. The copper foil makes up the power bus conductor 42 for the power bus layer 40. The lower surface of power bus layer 40 is formed of power bus conductor 42 (not visible in FIG. 1). Like ground bus conductor 36, power bus conductor 42 is relatively wide with respect to the overall width of cable 10 to allow for maximum current flow for the width of cable 10. Power bus layer 40 is bonded to ground bus layer 34 in the preferred embodiment of the present invention with an unsupported layer of 0.002 inch modified acrylic adhesive.

Extending from power bus layer 40 at regular intervals are power bus layer tabs 44. Power bus conductor tabs 46 extend from power bus conductor 42, electrodeposited on the bottom side of power bus layer tabs 44 in the same manner as power bus conductor 42 on power bus layer 40. Power bus layer tabs 44 are then folded on top of signal bus layer 16, in a form as shown in cross-section in FIG. 2. Access to power bus conductor 42 from the top side of cable 10 is thus achieved through the use of a folded tab 44. Top film power conductor opening 50 through top cover film 12 allows components attached on the top side of cable 10 to receive power through power conductor layer 42 by way of power bus layer tabs 44.

It will be seen that by employing this folded design, the cross-sectional area of power bus conductor 42 and ground bus conductor 36 need not be reduced at any point along the length of cable 10 while maintaining top-side electrically connective access to both power bus conductor 42 and ground bus conductor 36. This allows cable 10 to carry a relatively high current given its width. In the preferred embodiment, cable 10 is designed to carry up to 16 Amps of 28V current along power layer conductor 42 and ground layer conductor 36 with an overall cable 10 width of only 0.5 inches. The voltage drop over a 32 foot length of cable 10 at full power (28V@16A) does not exceed 2 VDC in the preferred embodiment.

Figure 4:
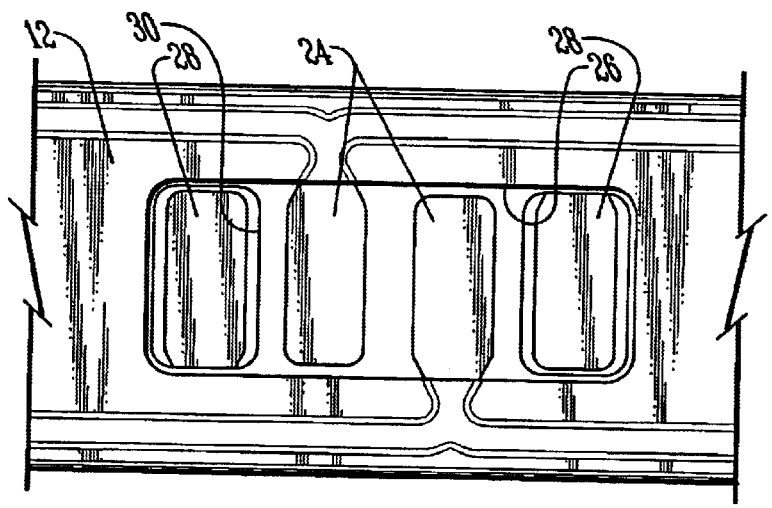
FIG. 4 is a top plan view of a section of a cable of a preferred embodiment of the present invention, showing signal and enumerator pad connections.

Referring now to FIG. 3, the result of this design in a preferred embodiment of the present invention to achieve power connections on the top side of cable 10 is illustrated. Power pad 54 is formed by the portion of power bus conductor tab 46 that is exposed by top film power conductor opening 50 after power bus layer tab 44 is folded over signal layer 16. Longitudinally adjacent to power pad 54 is ground pad 56, which is formed by the portion of ground layer conductor 36 that is exposed by ground layer conductor opening 38 passing through dielectric layers 32, enumerator layer 20, signal layer 16, and top film cover layer 12. Similarly, signal connections on the top side of cable 10 in a preferred embodiment of the present invention are illustrated in FIG. 4. Signal pads 24 are exposed to the top side of cable 10 through signal opening 26 in top cover film 12. Longitudinally adjacent to signal pads 24 are enumerator pads 28, which are exposed to the top side of cable 10 through signal opening 26 in top cover film 12 and signal layer opening 30. The groupings of power pads 54 and ground pads 56, as illustrated in FIG. 3, and signal pads 24 and enumerator pads 28, as illustrated in FIG. 4, are repeated at regular intervals along cable 10. The distance between these intervals, and the precise spacing of power pads 54, ground pads 56, signal pads 24, and enumerator pads 28, are dictated by the size and design of the components to which cable 10 provides power and signal inputs throughout the network of interest. In the preferred embodiment, the components are LED light modules approximately 3 inches in length, and thus the pad patterns shown are repeated at 3-inch intervals along the operable length of cable 10.

Figure 5:
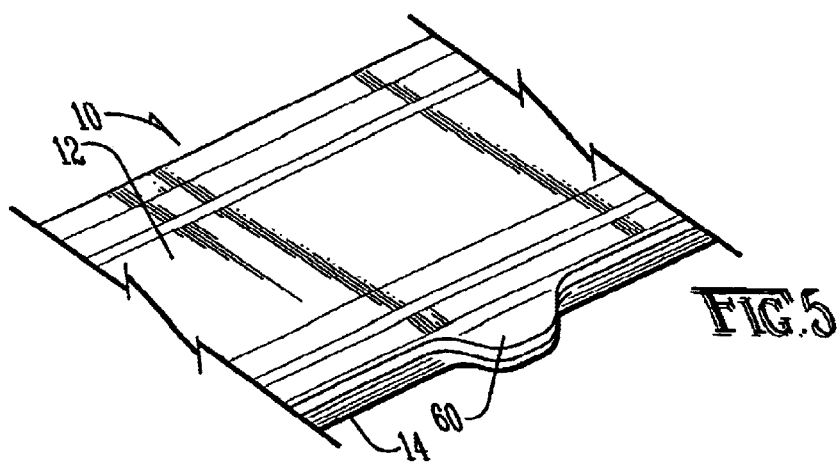
FIG. 5 is a perspective, cut-away view of a section of a cable of a preferred embodiment of the present invention, showing the locking tabs.

As illustrated in FIG. 5, cable 10 also preferably includes locking tabs 60 situated at periodic intervals along its length. The purpose of locking tabs 60 is to allow cable 10 to be "snapped" into a track or other mounting means in order to hold cable 10 firmly in place. In the preferred embodiment where cable 10 is used to connect components of an LED lighting system, locking tabs 60 hold cable 10 in a lighting track (not shown) used for mounting the LED light modules. Locking tabs 60 are formed by selectively removing layers within cable 10 prior to the lamination process by which top cover film 12 and bottom cover film 14 are applied.

Components (such as LED modules) may thus be connected together through cable 10 by simply snapping the components into place within the track or other mounting means, utilizing spring-based contacts on the bottom side of the components. The contacts between the pads of cable 10 and the contacts of the components is thus maintained by the pressure of the spring contacts. The result of this design is that all connections for a single component may be made simply by aligning the component at the proper place on cable 10 and snapping it into place. It may be noted that in a preferred embodiment, the end of cable 10 that connects to a base station, power module, or other source of power or control signals may be attached to a typical tail connector (not shown) as are known in the art.

The cable 10 used for this application must be capable of construction in long lengths. In the preferred embodiment, the cable must be capable of construction in lengths up to 32 feet, with active interconnect areas across the length of cable 10, in order to supply networks in aircraft and watercraft cabins and cabin spaces of various sizes. The network in which cable 10 is to be employed is modular for ease of design. The preferred embodiment is designed for use in connection with 3-inch long LED lighting modules, and hence the electrical connection pattern on cable 10 repeats every 3 inches.

The cable 10 described in this preferred embodiment of the present invention achieves numerous design advantages and overcomes the limitations of prior art flexible cabling. All interconnections between elements of the network (such as LED modules) other than through cable 10 are eliminated. The connections are low profile, and fit neatly within the mounting rack that is already required for the LED modules themselves. The connecting pads themselves are planar. Cable 10 may be field cut and terminated to any desired length. The cable may be mass produced using reel-to-reel fabrication techniques.

The present invention has been described with reference to certain preferred and alternative embodiments that are intended to be exemplary only and not limiting to the full scope of the present invention as set forth in the appended claims.

What is claimed is:

1. A flat cable, comprising:
   (a) a first power conducting layer, wherein said first power conducting layer comprises a first power conductor, and the width of said first power conductor is more than half of the width of the cable;
   (b) a second power conducting layer beneath said first power conducting layer, wherein said second power conducting layer comprises a second power conductor, and the width of said second power conductor is more than half of the width of the cable, and wherein said second power conductor further comprises a conducting tab folded around said first power conducting layer forming an electrical connecting pad over said first power conducting layer on a side of said first power conducting layer opposite said second power conducting layer;
   (c) a first signal conductor layer above said first power conducting layer; and
   (d) a top film layer above said first signal conductor layer, wherein said top film layer comprises openings for electrical connection to said signal conductor and said first and second power conducting layers.

2. The flat cable of claim 1, further comprising a dielectric layer between said first signal conductor layer and said first and second power conducting layers.

3. The flat cable of claim 2, further comprising a bottom film layer beneath said second power conducting layer.

4. The flat cable of claim 1, further comprising a second signal conductor layer between said first signal conductor layer and said dielectric layer.

5. The flat cable of claim 1, wherein said first signal conductor layer comprises a plurality of conducting strips.

6. The flat cable of claim 1, wherein said first signal conductor layer comprises a first signal conductor insulating film and a conducting strip.

7. The flat cable of claim 6, wherein said conducting strip is located at or near the edge of said first signal conductor layer.

8. The flat cable of claim 7, further comprising a first signal conductor pad electrically connected to said first signal conducting strip.

9. The flat cable of claim 8, wherein said first signal conductor pad extends laterally inwardly from said first signal conducting strip across the surface of said first signal conductor insulating film.

10. The flat cable of claim 2, further comprising a locking tab extending from the edge of said cable.

11. The flat cable of claim 1, wherein said first power conducting layer further comprises a first power layer insulating film bonded to said first power conductor and located between said first power conductor and said second power conductor.

12. The flat cable of claim 11, wherein said second power conducting layer further comprises a second power layer insulating film bonded to said second power conductor and located between said first power layer insulating film and said second power conductor.

13. A flat cable, comprising:
   (a) a signal layer;
   (b) a power layer comprising one of a power conductor and a ground conductor, said power layer being at least substantially as wide as the cable along its length;
   (c) a bus layer comprising a bus conductor at least substantially as wide as the cable along its length;
   (d) a dielectric layer between said signal layer and said power and bus layers;
   wherein one of said ground and power conductors further comprises a conducting tab extending outwardly from said one of said ground and power conductors;
   wherein said tab bends over the side of the other of said ground and power conductors opposite said one of said ground and power conductors; and
   wherein a top film comprises openings providing electrical communicative access to said signal layer, said tab, and said one of said power and bus conductors that does not comprise said tab.

14. The flat cable of claim 13, wherein said tab is bent over upon the cable such that the width of said cable at the widest point of said cable is not substantially greater than the width of said cable at its narrowest point.

15. The flat cable of claim 13, further comprising a top film that covers said signal layer and said tab in a continuous sheet.

* * * * *